United States Patent [19]

Wigley

[11] 4,204,247
[45] May 20, 1980

[54] HEAT DISSIPATING CIRCUIT BOARD ASSEMBLY

[75] Inventor: Patrick A. Wigley, Sunnyvale, Calif.

[73] Assignee: CPS, Inc., Sunnyvale, Calif.

[21] Appl. No.: 945,094

[22] Filed: Sep. 22, 1978

[51] Int. Cl.² ................................................ H05K 7/20
[52] U.S. Cl. .............................. 361/387; 174/16 HS; 361/386; 174/52 PE
[58] Field of Search .............................. 361/386–389; 174/16 HS, 52 PE

[56] References Cited

U.S. PATENT DOCUMENTS

| | | | |
|---|---|---|---|
| 3,261,904 | 7/1966 | Wulc | 174/16 HS |
| 3,355,540 | 11/1967 | Newell | 174/16 HS |
| 3,631,325 | 12/1971 | Wenz | 361/386 |
| 3,699,394 | 10/1972 | Schuler | 361/389 |
| 3,764,856 | 10/1973 | Martin | 361/387 |
| 4,060,847 | 11/1977 | Penrod | 174/16 HS |

*Primary Examiner*—Gerald P. Tolin
*Attorney, Agent, or Firm*—Flehr, Hohbach, Test

[57] ABSTRACT

An overall circuit board assembly is disclosed herein and includes specifically a printed circuit and board in an actual working embodiment which is comprised of a plurality of interconnected electronic components supported in circuit on one side of a support substrate and which is especially suitable for use with circuitry operated at a relatively high voltage-to-ground level. This assembly also includes an arrangement which dissipates heat generated by these electronic components for maintaining the printed circuit board relatively cool.

9 Claims, 3 Drawing Figures

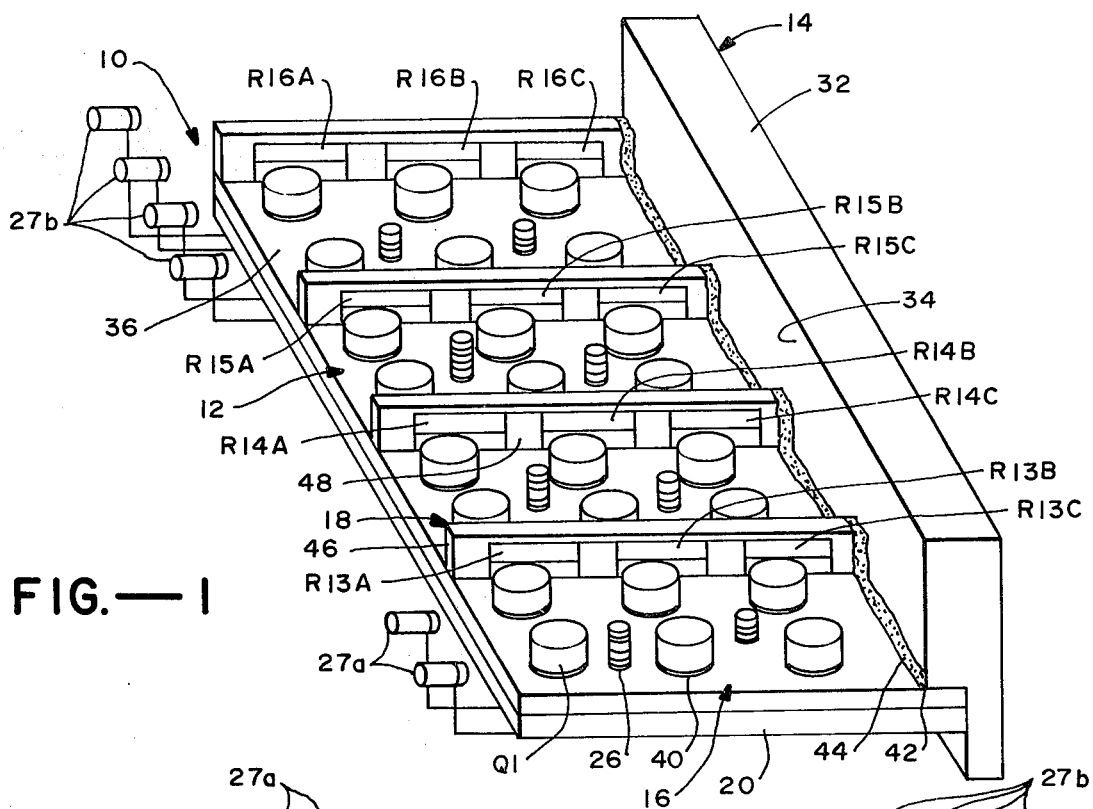
FIG.—1
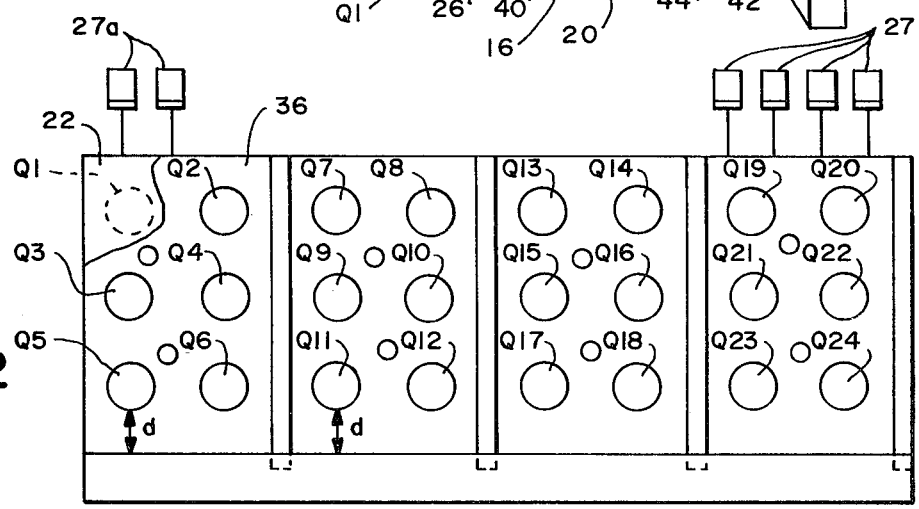
FIG.—2
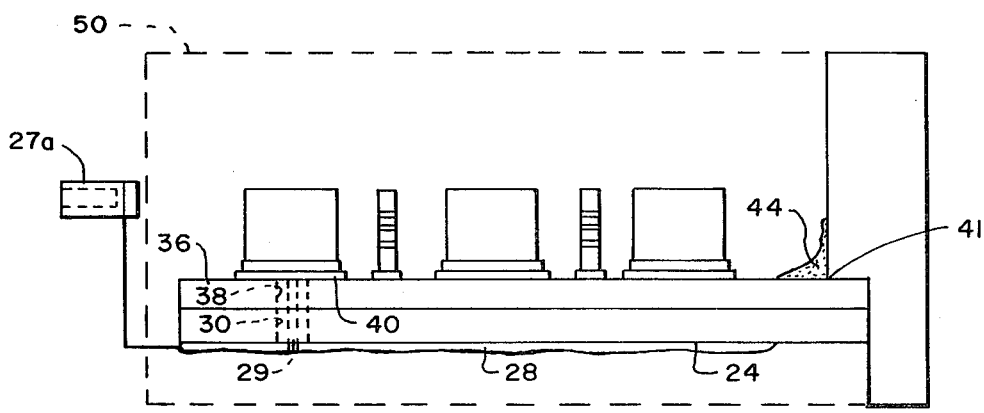
FIG.—3

HEAT DISSIPATING CIRCUIT BOARD ASSEMBLY

BACKGROUND OF THE INVENTION

The present invention relates generally to circuit boards and more particularly to an overall heat dissipating printed circuit board assembly which is especially suitable for high voltage or high voltage-to-ground applications and which, for reasons of efficiency, utilizes electrically conductive heat dissipating means in a preferred embodiment, specifically aluminum.

Conventional printed circuit boards do not normally include distinct heat dissipating arrangements such as air cooling arrangements, especially those circuit boards carrying circuits designated to operated at high voltages. In fact, to applicant's knowledge, those circuit boards which are designed to operate at high voltages do not include specific heat dissipating structure but, at most, are air cooled during operation. However, even this is not typically provided since air cooling has the tendency to draw in dust from the ambient surroundings which can accumulate within the cracks and crevices of the surrounding electronic components comprising part of the circuit board. Moreover, circuit boards which are air cooled cannot be readily encapsulated and thereby sealed from the dust and other foreign particles within its ambient surroundings.

As will be seen hereinafter, the present invention is directed to an overall circuit board assembly including a circuit board and specific heat dissipating structure for transferring heat generated at the circuit board by its electronic components to a remote location. As will also be seen, for reasons of efficiency, this structure includes electrically conductive heat dissipating means in a preferred embodiment, specifically an aluminum heat dissipating block adapted for connection to an adjacent thermally conductive frame.

While the utilization of aluminum or similar electrically conductive material for heat dissipation is certainly efficient from a heat transfer standpoint, it does raise certain problems if it is connected to an electrically conductive ground frame, which is typically the case. In doing this, however, the heat dissipating block also serves as a potential ground to the operating voltage on the printed circuit board which could disrupt the operation of its circuitry. This may be especially true with respect to circuitry operating at relatively high voltage. It may also be true with respect to circuits which operate at low floating voltages (high voltages but a low differential voltage) which display a relatively high voltage-to-ground level. However, in accordance with the present invention, the heat dissipating structure of applicant's overall assembly is specifically designed in a way which reliably provides high voltage standoff between the operating circuitry and the electrically conductive heat dissipating block sufficient to prevent the latter from inadvertantly grounding the circuitry and disrupting operation of the latter.

OBJECTS AND SUMMARY OF THE INVENTION

One object of the present invention is to provide an overall circuit board assembly including a circuit board, specifically a printed circuit board, which is especially suitable for operation at relatively high voltages or, in any event, at high voltage-to-ground levels.

Another object of the present invention is to provide an overall circuit board assembly including heat dissipating structure which is uncomplicated in design, economical to produce and reliable in use.

Still another object of the present invention is to utilize grounded electrically conductive heat dissipating block, specifically aluminum in a preferred embodiment, as part of the overall dissipating strucute for more efficiently transferring heat from the circuit board to a remote location.

Yet another object of the present invention is to provide voltage standoff between the circuit board circuitry and the electrically conductive heat dissipating block sufficient to prevent the block from grounding the circuitry and disrupting operation thereof.

A further object of the present invention is to provide an uncomplicated, economical and reliable method of dissipating heat from a circuit board, specifically a printed circuit board, in a structural way.

Still a further object of the present invention is to efficiently dissipate heat from the printed circuit board without disrupting the operation of its circuitry.

As will be seen hereinafter, the overall circuit board assembly disclosed herein may include a conventional printed circuit board including a plurality of electronic components interconnected in circuit with one another in a predetermined way, and a substrate for physically supporting these components. Moreover, in accordance with the present invention, the overall assembly also includes thermally conductive heat dissipating structure and thermally conductive and electrically non-conductive heat transfer structure which together operate to transfer heat away from the circuit board. The heat dissipating structure is spaced from the electronic components and is adapted for connection with an otherwise separate thermally conductive frame for dissipating heat thereto. The heat transfer structure is connected with the electronic components and the heat dissipating structure for transferring heat from the former to the latter for dissipation thereby.

In a preferred embodiment of the present invention, the heat dissipating structure includes an electrically conductive heat dissipating block, specifically one constructed of aluminum, for efficiently transferring heat away from the circuit board, as stated previously. However, the overall heat dissipating arrangement including the heat dissipating structure and the heat transfer structure is specifically designed to provide high voltage standoff between the circuit board circuitry and the aluminum block, as also stated previously.

BRIEF DESCRIPTION OF THE DRAWINGS

FIG. 1 is a perspective view of an overall circuit board assembly constructed in accordance with the present invention.

FIG. 2 is a plan view of the circuit board assembly illustrated in FIG. 1.

FIG. 3 is a side elevational view of the circuit board assembly illustrated in FIG. 1.

DETAILED DESCRIPTION AND PREFERRED EMBODIMENTS

Turning now to the drawing, where like components are designated by like reference numerals, an overall circuit board assembly constructed in accordance with the present invention is illustrated and generally designated by the reference numeral 10. As will be discussed in more detail hereinafter, this assembly includes a printed circuit board 12 and an overall heat dissipating arrangement including dissipating means generally indicated at 14 and heat transferring means generally indicated at 16. In a preferred embodiment, assembly 10 also includes at least one but more than likely a number of heat dissipating resistor networks generally indicated at 18.

As illustrated in all of the figures, printed circuit board 12 includes a conventional substrate support 20 having a top side 22 (FIG. 2) and a bottom side 24 (FIG. 3). The printed circuit board also includes a plurality of conventional electronic components generally designated at 26 and input and output terminals 27a and 27b. The electronic components are located directly over front side 22 and are in interconnected in circuit with one another and with the input and output terminals in a predetermined way by conventional circuit board interconnect means generally indicated at 28 located on the underside of the substrate support, that is, on bottom side 24. In this regard, each of the electronic components 26 includes one or more leads 29 extending through openings 30 in support 20 and connected to means 28.

In an actual working embodiment of the present invention, the circuitry in the circuit board thus far described (including the resistors in network 18, to be described) is the same pullup/pulldown circuitry making up one module comprising part of the overall circuit arrangement which is described in U.S. patent application, Ser. No. 892,132, filed Mar. 31, 1978, entitled VOLTAGE POWER SUPPLY and assigned to the assignee of the present application. As described in that application, each module making up the overall pullup/pulldown arrangement operates up to a maximum of 5 Kv and includes a number of transistors, resistors and diodes, as described therein. As specifically discussed in this co-pending application, the various transistors of each module are divided into 12 high voltage Darlington circuits, each including 2 transistors Q1 and Q2, Q3 and Q4 and so on, and each pair is biased by a resistor R13a, R13b, R13c, R14a, R14b and so on, as illustrated in FIG. 8 of the co-pending application and FIG. 2 herein.

As will be discussed hereinafter, the resistors R13 (a through c) comprise part of one resistance network 18 as do resistors R14 (a, b and c), R15 (a, b and c) and R16 (a, b and c) in this actual working embodiment. As stated previously, during operation of the pullup/pulldown circuit arrangement, a voltage as high as 5 Kv may be applied across each module. This means that as much as 416 v is applied across any given stage, that is, across any given Darlington circuit. Moreover, this particular circuit has been found to dissipate as much a 16 watts during its operation. Based on these operating perameters, it is important to dissipate the heat generated during operation of this circuit arrangement and it is also important to do this in an efficient manner without interrupting its operation. As will be seen hereinafter, this is accomplished in a preferred embodiment of the present invention by utilizing an electrically conductive heat dissipating block, specifically aluminum, as part of heat dissipating means 14. However, as will also be seen, this is accomplished while maintaining high voltage standoff between this block and the circuitry comprising part of circuit board 12.

As illustrated best in FIG. 1, heat dissipating means 14 include a thermally conductive block as just stated, the block being generally designated at 32. This block extends longitudinally along one edge of substrate support 20 and surface 34 extending upward from top side 22 in a plane normal thereto. In an actual working embodiment, heat dissipating arrangement 14 consists of block 32 which, in this embodiment, is constructed of aluminum having a black anodized surface and suitable means (not shown) for connecting it in physical contact with a thermally conductive and electrically conductive frame (also not shown) for transferring the heat thereto.

As stated previously, means 16 is provided for transferring heat from electronic components 26 to heat dissipating means 14. To accomplish this, heat transferring means 16 includes a thermally conductive and electrically non-conductive substrate 36, specifically alumina in a preferred embodiment. As seen in the various figures, this substrate is positioned directly over and against top side 22 of substrate support 20 between the latter and base of electronic components 26. As best seen in FIG. 3, substrate 36 includes a plurality of through holes 38 which are aligned with openings 30 for providing access between the electrical components and interconnect means 28 for leads 29. These two substrates may be held together in this position in any suitable way, for example by means of epoxy adhesive. In order to assure a reliable thermal connection between each electronic component and substrate 36, overall heat transferring means 16 may also include a heat conductive washer 40 located between the base of each electronic component (or at least those components which normally generate a relatively large amount of heat) and the top surface of substrate 36 in physical engagement with each. In a preferred embodiment, these washers are thermally conductive silicon washers commonly referred to as SILI PADS (trademark).

As best illustrated in FIGS. 1 and 3, thermally conductive substrate 36 meets the upstanding surface 34 of heat dissipating block 32 at a 90° juncture which is generally designated at 42 and which extends the entire length of both the substrate and the heat dissipating block. While the substrate is maintained in contact with the heat dissipating block by suitable means (not shown) for transferring heat from the former to the latter, in a preferred embodiment, overall heat transferring means 12 includes a bead of conventional thermally conductive epoxy 44, which fills juncture 42 along its entire length. In this way, heat generated by electronic components 26 may be readily dissipated by first passing through washers 40 and along substrate 36 directly to heat dissipating block 32 or indirectly to the block through epoxy bead 44.

As stated previously, overall assembly 10 may include at least one but preferably a number of resistance networks 18. In an actual working embodiment, each of these arrangements includes a network of interconnected resistors, specifically biasing resistors R13a, R13b, R13c, R14a, and so on, comprising part of the pullup/pulldown arrangement described in the Wigley et al co-pending application recited above. In this actual working embodiment, the resistors making up each resistance arrangement are cermet films deposited on a separate thermally conductive, electrically non-conductive substrate 46 which is constructed of alumina in this embodiment but which may be constructed of any suitable thermally conductive, electrically non-conductive material. As best seen in FIG. 1, these resistors are interconnected in circuit with the rest of the components in the overall circuit board 12 by means of electrical interconnected leads 48 which extend through substrate 36 and support 20 to interconnect means 28. The entire resistor supporting substrate of each resistance arrangement is mounted on edge on top of heat transferring substrate 36 in a vertical plane, that is, in a plane normal to the heat transferring substrate. As best seen in FIG. 2, each substrate 46 extends from the free lengthwise edge of substrate 36 to heat dissipating block 32 where an end portion fits within a cooperating slot in the latter. While these resistor supporting substrates are maintained in physical contact with heat dissipating block 32 for transferring heat thereto, in a preferred embodiment, previously described epoxy bead 42 extends around the juncture between each resistor supporting substrate and the heat dissipating block. In this way, heat generated by the various resistors comprising part of each resistance arrangement is transferred directly to the heat dissipating block by its associated substrate and indirectly through epoxy bead 44.

Having described overall printed circuit board 10, the particular way in which it dissipates heat should be quite apparent. However, it is worth noting its particular applicability with regard to the pullup/pulldown circuit arrangement described in the co-pending Wigley et al application or any circuit which operates on high voltage or even low floating voltage (having a high voltage-to-ground characteristic). As stated previously with regard to the pullup/pulldown circuit arrangement, a voltage as high as 416 volts appears across each Darlington pair, that is, each pair of transistors Q1 and Q2, Q3 and Q4 and so on, during operation of the circuit arrangement. As also stated previously, a total of 5000 volts (5 Kv) appears across each module making up the overall circuit arrangement, that is, across the 12 Darlington pairs starting with transistors Q1 and Q2. Accordingly, from a potential to ground standpoint, as much as 3750 volts appear at transistor pair Q5 and Q6 during operation of the overall module, that is, when the overall module is operating at 5 Kv, the voltage between transistor pair Q5, Q6 and ground will be three-quarters or 5 Kv or 3750 volts. The voltage-to-ground values for the other transistor pairs can be readily calculated using the same reasoning, for example, a maximum voltage of 2500 volts, (one-half of 5 Kv), will appear between transistor pair Q11, Q12 and ground and a voltage of 1250 volts (twenty-five percent of 5 Kv) will appear between transistor pair Q17, Q18 and ground. Moreover, 5 Kv may be added to the voltage just recited when the module is one of the three top modules in the overall pullup/pulldown circuit arrangement described in the Wigley et al co-pending application, specifically module 4, 5 or 6 illustrated in FIG. 1 of that application since the series connected top module may operate at 5 Kv simultaneously therewith.

In view of the relatively high voltages appearing across the various pairs of transistors including transistors Q5, Q6 and so on, it should be readily apparent that an electrically conductive material positioned too close to these components may result in grounding the circuit including the components which, of course, would disrupt operation of the overall arrangement. On the other hand, as stated previously, electrically conductive material, specifically aluminum is one of the more efficient means of dissipating heat, especially compared to nonconductive materials such as alumina. However, in accordance with a preferred embodiment of the present invention, assembly 10 uses both to advantage. Specifically, the alumina is used in constructing heat transferring substrate 36 and resistor supporting substrate 46 all of which are close to the electronic components. However, aluminum is used in constructing heat dissipating block 32 in this preferred embodiment. Moreover, this latter block is positioned sufficiently far from the electronic components, specifically from the transistors Q5 and Q6 to provide high voltage standoff (no voltage-to-ground leakage) therebetween. In this regard, it should be noted that transistors Q5 and Q6 in the pullup/pulldown arrangement are two of the closest electronic components to electrically conductive block 32 (along with transistors Q11, Q12, Q17, Q18, Q23 and Q24) and operate at the highest voltage as compared to these closest components (at a maximum of 3750 volts). Hence, if there is voltage standoff between these transistors Q5 and Q6 and the heat dissipating block, there will be voltage standoff between the rest of the components and this block. The exact distance between the block and these components to establish standoff may vary but can be readily determined by those with ordinary skill in the art. In the actual working embodiment thus far discussed, this distance indicated at "d" in FIG. 2 is approximately 0.25 inches. However, in general this will vary from component to component depending on its operating voltage.

It is to be understood that the foregoing discussion of the pullup/pulldown circuit arrangement described in the Wigley et al co-pending application has been provided for examplary purposes only and specifically to illustrate the need to take voltage standoff into account when designing overall assembly 10 with an electrically conductive heat dissipating block, for example one constructed of aluminum. However, it is also to be understood that the present invention is not limited to an overall circuit board assembly which includes the specific pullup/pulldown circuit arrangement described but many include a circuit board supporting circuits of all types with or without transistors generally and with or without specific transistors Q1, Q2 and so on, or resistor arrangements 18. Moreover, as illustrated in FIG. 3, the entire circuit board assembly, with the exception of terminals 27a and 27b and block 32, may be encapsulated in electrically non-conductive means, specifically epoxy in a preferred embodiment, indicated generally at 50 by dotted lines in FIG. 3. In this regard, since assembly 10 has its own heat dissipating structure, epoxy 50 does not need to be of a high thermally conductive grade.

What is claimed is:

1. A heat dissipating printed circuit board assembly especially suitable for handling high voltage-to-ground circuits, comprising:
   (a) a printed circuit board including
   (i) a substrate support having a frontside and a backside,
   (ii) a plurality of electronic components located on said frontside,
   (iii) electrically conductive means located on said backside and interconnecting said components in circuit with one another in a predetermined way, and
   (iv) terminal input and output means electrically connected in circuit with said electrical components;
   (b) a heat conductive and electrically conductive heat dissipating block extending along one edge of said support and having a surface projecting up from and normal to the frontside of said support, said block being spaced predetermined distances from said components, said block being adapted for connection to an electrically grounded, thermally conductive frame for dissipating heat thereto;

(c) heat conductive and electrically non-conductive heat transfer means connected to said electronic components and said block for transferring heat from said components to said heat dissipating block for dissipation thereby, said heat transfer means including (i) a heat conductive and electrically non-conductive substrate located over and in confronting relationship with the frontside of said support, (ii) heat conductive and electrically non-conductive means thermally connecting said substrate with said electronic components, and (iii) heat conductive and electrically non-conductive means thermally connecting said substrate with said block;

(d) at least one resistance arrangement including (i) a network of interconnected resistors, (ii) means for electrically interconnecting said resistors in circuit with said electronic components, and (iii) a heat conductive and electrically non-conductive substrate supporting said resistors and extending entirely within a plane transverse to said heat transferring substrate and block, said resistor supporting substrate being in physical contact with said resistors and said block for transferring heat from said resistors to said block for dissipation thereby; and (e) electrically non-conductive means for encapsulating (i) said printed circuit board including its support, electronic components and component interconnect means, while allowing said terminal input and output means to extend through said encapsulating means, (ii) said heat transferring substrate, and (iii) said resistance arrangement including its resistors, resistor supporting substrate and interconnect means.

2. An assembly according to claim 1 wherein said block is constructed of aluminum.

3. A circuit board assembly, comprising (a) a circuit board including (i) a substrate support having a frontside and a backside, (ii) a plurality of electronic components, located on said frontside, and (iii) electrically conductive means located on said backside and interconnecting said components in circuit with one another in a predetermined way;

(b) heat conductive heat dissipating means including a heat conductive block extending along one edge of said support and spaced predetermined distances from said electronic components and component interconnect means, said heat dissipating means being adapted for connection to a thermally conductive frame for dissipating heat thereto;

(c) heat conductive and electrically non-conductive heat transfer means including a heat conductive and electrically non-conducting substrate positioned over the frontside of said support and connected to said electronic components and said heat dissipating means for transferring heat from said components to said heat dissipating means for dissipation thereby; and (d) at least one resistance arrangement, said arrangement including a network of interconnected resistors, means for electrically interconnecting said resistors in circuit with said components, and a heat conductive and electrically non-conductive substrate supporting said resistors and extending entirely within a plane transverse to said heat transferring substrate and said heat dissipating block, said resistor supporting substrate being in physical contact with said resistors and said block for transferring heat from the resistors to said block for dissipation thereby.

4. An assembly according to claim 3 wherein said block has a surface normal to said resistance substrate and wherein said plane is normal to said heat transferring substrate and said surface.

5. A heat dissipating printed circuit board assembly especially suitable for handling high voltage-to-ground circuits, comprising:

(a) a printed circuit board substrate support having a planar frontside, a backside and a plurality of through holes extending between said frontside and said backside;

(b) heat conductive and electrically non-conductive heat transfer means including a heat conductive and electrically non-conductive substrate having a top surface, a bottom planar surface and an equal plurality of through holes extending between said top and bottom surfaces, said substrate being located over said printed circuit board substrate support such that said bottom surface is in confronting relationship and engages against the entire frontside of said substrate support and such that the second-mentioned through holes are aligned with the first-mentioned through holes;

(c) a plurality of electronic components located in heat transferring engagement with said heat conductive and electrically non-conductive substrate over the top surface of the latter;

(d) electrically conductive means located on the backside of said printed circuit board substrate support and through said aligned through holes for interconnecting said electronic components in circuit with one another in a predetermined way;

(e) terminal input and output means electrically connected in circuit with said electrical components;

(f) a heat conductive and electrically conductive heat dissipating block extending along substantially the entire length of one edge of said printed circuit board substrate support and having a surface projecting up from the frontside of said support in heat transferring engagement with an adjacent edge of said heat conductive and electrically non-conductive substrate, said block being spaced predetermined distances from said electrical components and being adapted for connection to an electrically grounded, thermally conductive frame, whereby heat generated by said electronic components is adapted to be dissipated to said frame by first passing through said heat conductive and electrically non-conductive substrate and then said heat conductive and electrically conductive heat dissipating block.

6. An assembly according to claim 5 wherein said heat transferring means includes means separate from said heat transferring substrate for thermally connecting the latter with said electronic components, said separate means including heat conductive and electrically non-conductive washers located between and physically engaging said components and said substrate.

7. An assembly according to claim 6 wherein said substrate and block meet at a juncture along said support edge and wherein said heat transferring means includes a heat conductive electrically non-conductive epoxy extending along and filling said juncture in physical contact with said substrate and block.

8. An assembly according to claim 7 wherein said heat dissipating block is constructed of aluminum and said heat transferring substrate is constructed of alumina.

9. An assembly according to claim 7 including electrically non-conductive means encapsulating said circuit board including its substrate support, components and component interconnect means, and heat transferring substrate, said circuit board including terminal input and output means extending through said encapsulating means and connected in circuit with said components.

* * * * *